(12) United States Patent
Wu et al.

(10) Patent No.: US 10,559,497 B2
(45) Date of Patent: Feb. 11, 2020

(54) SEAMLESS TUNGSTEN FILL BY TUNGSTEN OXIDATION-REDUCTION

(71) Applicant: Applied Materials, Inc., Santa Clara, CA (US)

(72) Inventors: Yong Wu, Sunnyvale, CA (US); Yihong Chen, San Jose, CA (US); Shishi Jiang, Santa Clara, CA (US); Ziqing Duan, San Jose, CA (US); Abhijit Basu Mallick, Palo Alto, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/006,402

(22) Filed: Jun. 12, 2018

(65) Prior Publication Data
US 2018/0358264 A1 Dec. 13, 2018

Related U.S. Application Data

(60) Provisional application No. 62/518,534, filed on Jun. 12, 2017.

(51) Int. Cl.
| *H01L 21/00* | (2006.01) |
| *H01L 21/768* | (2006.01) |
| *H01L 21/285* | (2006.01) |
| *H01L 23/532* | (2006.01) |
| *H01L 21/02* | (2006.01) |

(52) U.S. Cl.
CPC .. *H01L 21/76888* (2013.01); *H01L 21/28556* (2013.01); *H01L 21/7684* (2013.01); *H01L 21/76805* (2013.01); *H01L 21/76895* (2013.01); *H01L 21/02244* (2013.01); *H01L 23/53257* (2013.01)

(58) Field of Classification Search
CPC ......... H01L 21/76888; H01L 21/76805; H01L 21/76895
See application file for complete search history.

(56) References Cited

U.S. PATENT DOCUMENTS

| 8,357,613 | B2* | 1/2013 | Choi | H01L 21/321 257/E21.585 |
| 8,575,753 | B2 | 11/2013 | Choi et al. | |
| 2010/0203725 | A1* | 8/2010 | Choi | H01L 21/321 438/663 |
| 2011/0104891 | A1 | 5/2011 | Al-Bayati | |
| 2012/0171846 | A1 | 7/2012 | Hwang | |
| 2015/0170956 | A1 | 6/2015 | Naik et al. | |

FOREIGN PATENT DOCUMENTS

KR 20110108546 A 10/2011

OTHER PUBLICATIONS

PCT International Search Report and Written Opinion in PCT/US2018/037088 dated Oct. 2, 2018, 12 pages.

* cited by examiner

*Primary Examiner* — Laura M Menz
(74) *Attorney, Agent, or Firm* — Servilla Whitney LLC

(57) ABSTRACT

Methods for filling a substrate feature with a seamless tungsten fill are described. The methods include depositing a tungsten film, oxidizing the tungsten film to a tungsten oxide pillar, reducing the tungsten oxide film to a seamless tungsten gapfill and optionally depositing additional tungsten on the tungsten gapfill.

15 Claims, 1 Drawing Sheet

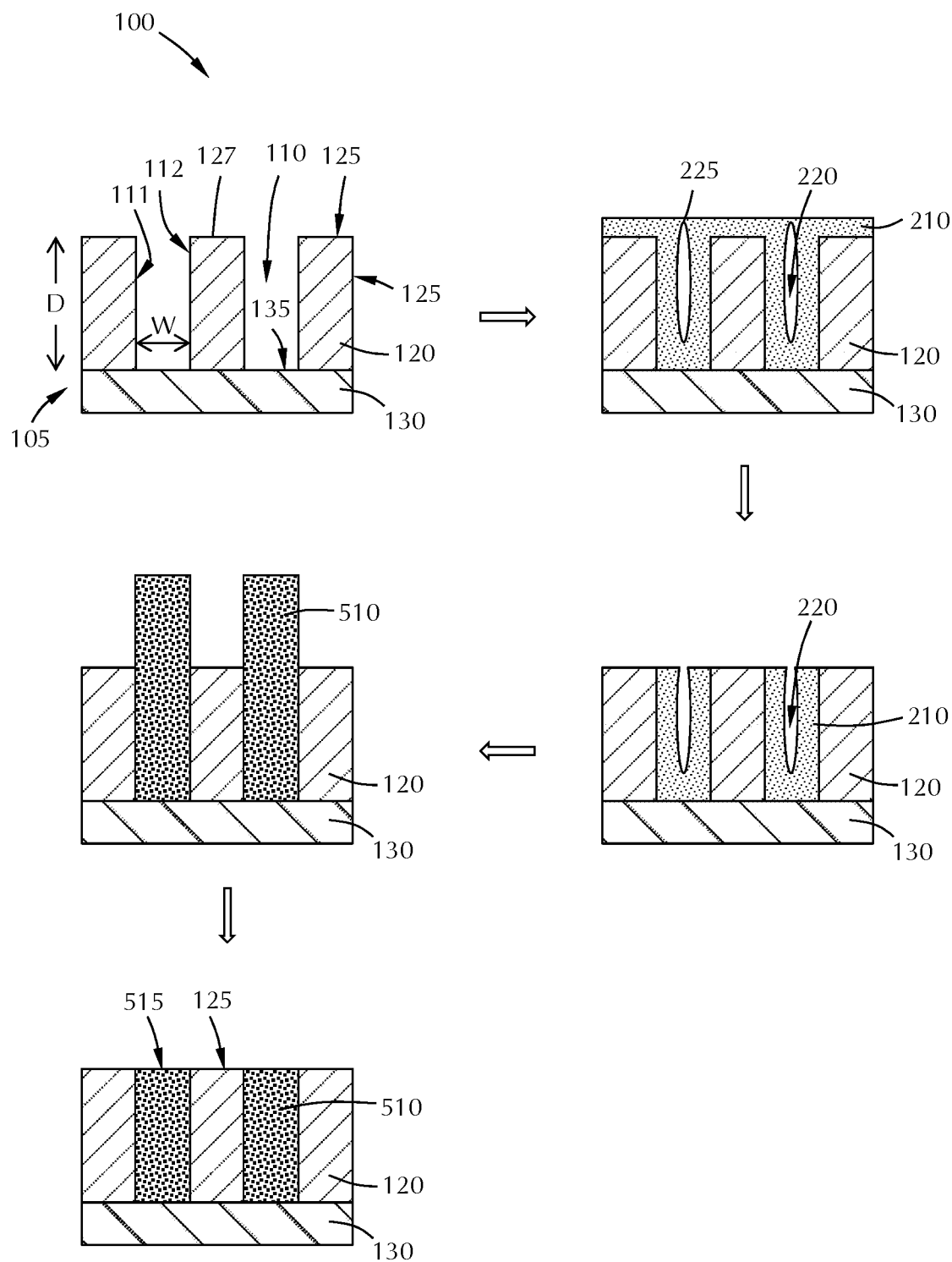

SEAMLESS TUNGSTEN FILL BY TUNGSTEN OXIDATION-REDUCTION

CROSS-REFERENCE TO RELATED APPLICATIONS

This application claims priority to U.S. Provisional Application No. 62/518,534, filed Jun. 12, 2017, the entire disclosure of which is hereby incorporated by reference herein.

FIELD

Embodiments of the disclosure generally relate to methods for filling substrate features with a seamless tungsten fill. More particularly, embodiments of the disclosure are directed to methods for filling a substrate feature with a seamless tungsten fill through a deposition-oxidation-reduction process.

BACKGROUND

The gapfill process is a very important stage of semiconductor manufacturing. The gapfill process is used to fill a high aspect ratio gap (or feature) with an insulating or conducting material. For example, shallow trench isolation, inter-metal dielectric layers, passivation layers, dummy gate, etc. As device geometries shrink (e.g., critical dimensions <20 nm) and thermal budgets are reduced, defect-free filling of spaces becomes increasingly difficult due to limitations of conventional deposition processes.

Most deposition methods deposit more material on the top region than on the bottom region of a structure. The process often forms a mushroom shape film profile. As a result, the top part of a feature sometimes pinches off prematurely leaving seams or voids within the structure's lower portions. This problem is more prevalent in small features.

Atomic layer deposition of tungsten for gap filling has been demonstrated to be a key technology in semiconductor industry. However, the seam in the gap fill is a limitation in ALD tungsten deposition. Therefore, there is need for a method to create a seamless tungsten fill.

SUMMARY

One or more embodiments of the disclosure are directed to a method of substrate processing comprising providing a substrate with a first substrate surface of a first material and a second substrate surface of a second material. The substrate has at least one feature with a sidewall and a bottom. The sidewall is formed by the first substrate surface and the bottom is formed by the second substrate surface. A tungsten film is formed on the substrate. The tungsten film has a seam formed within the feature and an overburden formed on the first substrate surface outside the feature. The substrate surface is planarized to remove the overburden from the first substrate surface so that a top of the tungsten film is about coplanar with the first substrate surface outside the feature. The tungsten film is oxidized to form a tungsten oxide pillar which extends from the substrate feature without a seam. The tungsten oxide pillar is reduced to tungsten. The tungsten forms a substantially seamless tungsten gapfill within the feature.

Another embodiment of the disclosure is directed to a method of substrate processing comprising providing a substrate with at least one feature formed in a substrate surface. The feature extends a distance from the substrate surface and has a sidewall and a bottom. The sidewall of the feature and the substrate surface are comprised of a first material and the bottom is comprised of a second material different from the first material. A tungsten film is formed on the substrate so that there is a void within the tungsten film within the feature as well as a tungsten overburden formed on the substrate surface. The substrate is planarized to remove the tungsten overburden from the substrate surface so that a top of the tungsten film is substantially coplanar with the substrate surface. The tungsten film is oxidized to form a pillar of tungsten oxide extending from the feature without a seam. The pillar of tungsten oxide is reduced to form a substantially seamless tungsten gapfill within the at least one feature.

Other embodiments of the disclosure are directed to a method of substrate processing comprising providing a substrate with a first substrate surface of a first material and a second substrate surface of a second material. The first material is comprised of a dielectric material and the second material is comprised of a conductive material. The substrate has at least one feature with a sidewall and a bottom. The sidewall is formed by the first substrate surface and the bottom is formed by the second substrate surface. A tungsten film is formed on the substrate by atomic layer deposition. The tungsten film has a closed seam formed within the feature and an overburden formed on the first substrate surface outside the feature. A top of the seam is above the sidewall of the feature. The substrate surface is planarized to remove the overburden from the first substrate surface so that a top of the tungsten film is about coplanar with the first substrate surface outside the feature and the top of the seam is removed. The tungsten film is oxidized by a thermal oxidation process or a plasma oxidation process to form a tungsten oxide pillar which extends from the feature without a seam. The tungsten oxide pillar is reduced to tungsten by a thermal reduction process or a plasma reduction process. The tungsten forms a substantially seamless tungsten gapfill within the feature, and a top of the tungsten gapfill is less than or equal to about 10 Å below the first substrate surface outside of the feature. Additional tungsten is deposited on the tungsten gapfill to raise the top of the tungsten gapfill to be substantially coplanar with the first substrate surface outside of the feature by depositing a silicon film on the tungsten gapfill and exposing the silicon film to a tungsten halide to convert the silicon film to tungsten.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE shows a cross-sectional schematic of a gapfill process in accordance with one or more embodiments of the disclosure.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

The FIGURE shows a cross-sectional view of a substrate 105 with two features 110 (e.g. trenches). The FIGURE shows a substrate having two features for illustrative purposes; however, those skilled in the art will understand that there can be fewer or more than two features. The shape of the feature 110 can be any suitable shape including, but not limited to, trenches and cylindrical vias. In specific embodiments, the feature 110 is a trench. As used in this regard, the term "feature" means any intentional surface irregularity. Suitable examples of features include, but are not limited to trenches which have a top, two sidewalls and a bottom, peaks (or fins) which have a top and two sidewalls extending upward from a surface and vias which have sidewalls extending down from a surface with an open bottom. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 105 is comprised of two materials which form two substrate surfaces: a first material 120 forms a first substrate surface 125 and a second material 130 forms a second substrate surface 135. The feature 110 extends from a first substrate surface 127 outside the feature 110 to a depth D to the second substrate surface 135. The feature 110 has a first sidewall 111 and a second sidewall 112 that define a width W of the feature 110. The first sidewall 111 and the second sidewall 112 are comprised of the first material 120. The open area formed by the sidewalls and bottom are also referred to as a gap. Materials which fill the gap are referred to as gapfill or gapfill materials.

In some embodiments, the first material 120 and the second material 130 are the same. In some embodiments, the first material 120 and the second material 130 are different. In some embodiments, the first material 120 comprises a dielectric material and the second material 130 comprises a conductive material, or vice versa.

Examples of dielectric materials include, but are not limited to, silicon dioxide, silicon oxide, carbon doped oxide ("CDO"), e.g., carbon doped silicon dioxide, porous silicon dioxide, silicon nitride or any combination thereof. Additional examples of dielectric materials include, but are not limited to, nitrides, oxides, certain polymers, phosphosilicate glass, fluorosilicate (SiOF) glass, organosilicate glass (SiOCH), polyimides, epoxies, photodefinable materials, such as benzocyclobutene (BCB), and WPR-series materials, or spin-on-glass.

Examples of conductive materials include, but are not limited to, metals, metal oxides, metal nitrides, metal carbides and combinations thereof. In some embodiments, the first material 120 comprises silicon oxide and the second material 130 comprises cobalt or copper.

With reference to the FIGURE, one or more embodiments of the disclosure are directed to methods 100 of substrate processing which provide seam free tungsten gapfill in substrate features. A tungsten film 210 is formed on the substrate. Within the gap, a partial film forms along the sidewalls and the bottom, but contains a seam 220. In some embodiments, the seam is a byproduct of film deposition. For example, higher aspect ratio features are more likely to form a seam during deposition as the film at the top of the feature tends to pinch close so that the void is enclosed within the deposited film. The seam 220 can be any gap, space or void that forms between the sidewalls 111, 112 of the feature 110.

In some embodiments, similar to the FIGURE, the tungsten film 210 is deposited such that the seam 220 is covered over by the tungsten film or "closed". In these embodiments, the seam 220 has a top 225. In some embodiments, the top 225 of the seam 220 may extend above the first material surface 127 outside of the feature 110.

In some embodiments, the tungsten film is not deposited such the seam 220 is not covered by the tungsten film. In embodiments of this sort, the seam 220 remains open at the top of the film.

The tungsten film 210 can be formed by any suitable process including, but not limited to, chemical vapor deposition, plasma-enhanced chemical vapor deposition, atomic layer deposition, plasma-enhanced atomic layer deposition and/or physical vapor deposition. In some embodiments, the tungsten film 210 is formed by atomic layer deposition.

After filling the gap, the over-burden (i.e., tungsten deposited on top of the substrate outside of the gap) is removed by a chemical-mechanical planarization (CMP) process. In some embodiments, the CMP process is performed such that the top of the tungsten film 210 is about coplanar with the first substrate surface 127 outside the feature 110. In these embodiments, if the top 225 of the seam 220 is above the first substrate surface outside 127 of the feature 110, the top of the seam will be removed during planarization. In some embodiments, the top of the tungsten film 210 is substantially coplanar with the first substrate surface outside 127 of the feature 110. As used in this manner, the term "substantially coplanar" means that a plane formed by the first surface and a plane formed by the tungsten film are within ±5 Å, 4 Å, 3 Å or 2 Å.

After planarization, the tungsten film 210 is oxidized to form a tungsten oxide pillar 410. The tungsten oxide pillar is formed through a thermal oxidation process or a plasma oxidation process. Regardless of any seams within the tungsten film a feature, the tungsten oxide pillar 410 does not have a seam. During oxidation, the fidelity of the gap shape is maintained on the top of the feature so that the tungsten oxide pillar 410 grows straight up from the feature 110. As used in this regard, "straight up" means that the sides of the tungsten oxide pillar 410 are substantially coplanar with the sidewall 111, 112 of the feature 110. A surface is coplanar with the sidewall 111 where the angle formed at the junction of the sidewall 114 and the surface is ±10°.

A thermal oxidation process is an oxidation process which is promoted through the use of specific reactants and heat, without the use of plasma. Examples of thermal oxidation reactants include, without limitation, $O_2$, $O_3$, $N_2O$, $H_2O$, $H_2O_2$, CO, $CO_2$ and combinations thereof.

A plasma oxidation process is an oxidation process promoted through the formation of radicals of specific reactants. Examples of plasma oxidation reactants include, without limitation, plasmas of $O_2$, $O_3$, $H_2O$, $H_2O_2$ and combinations thereof. The plasma oxidation process can be a direct plasma or a remote plasma. The plasma oxidation process can be a conductively coupled plasma (CCP) or an inductively coupled plasma (ICP). In some embodiments, the oxidation process is radical enhanced in which an oxidizing gas is passed across a hot wire to generate radicals within the gas without ionizing the gas.

After oxidation, the tungsten oxide pillar 410 is reduced to form a tungsten gapfill 510. The tungsten gapfill is substantially seamfree. The tungsten gapfill 510 has a top 515 which may be higher, lower, or about coplanar with the first substrate surface outside the feature 127. The tungsten oxide pillar is reduced through a thermal reduction process or a plasma reduction process.

A thermal reduction process is a reduction process which is promoted through the use of specific reactants and heat, without the use of a plasma. Examples of thermal reduction reactants include, without limitation, hydrogen, alcohols, carboxylic acids, aldehydes, silanes, boranes, ammonia, hydrazine, hydrazine derivatives and combinations thereof.

A plasma reduction process is a reduction process promoted through the formation of radicals and/or ions of specific reactants. Examples of plasma reduction reactants include, without limitation plasmas of hydrogen, ammonia, hydrazine, hydrazine derivatives and combinations thereof.

In some embodiments, after reducing the tungsten oxide pillar, the top 515 of the tungsten gapfill 510 is within ±10 Å of being coplanar with the first substrate surface 125 outside of the feature 127. In other words, the depth of the tungsten gapfill 510 is within ±10 Å of the feature depth, D. In some embodiments, the top 515 of the tungsten gapfill 510 is below or lower than the first substrate surface 125 outside of the feature. In other words, the depth of the tungsten gapfill 510 is less than the feature depth D. In some embodiments, after reducing the tungsten oxide pillar, the top 515 of the tungsten gapfill 510 is within ±5 Å of being coplanar with the first substrate surface 125 outside of the feature 127.

While not pictured in the FIGURE, in embodiments in which the top 515 of the tungsten gapfill 510 is below the first substrate surface 125 outside of the feature 127, the substrate processing may further comprise selectively depositing additional tungsten on the tungsten gapfill 510. Deposition of additional tungsten can raise the top 515 of the tungsten gapfill 510 to be substantially coplanar with the first substrate surface 125 outside of the feature 127. In some embodiments, this deposition of additional tungsten comprises depositing a silicon film on the tungsten gapfill 510 and exposing the silicon film to a tungsten halide to convert the silicon film to tungsten.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of substrate processing comprising:
    providing a substrate with a first substrate surface of a first material and a second substrate surface of a second material, the substrate having at least one feature with a sidewall and a bottom, the sidewall formed by the first substrate surface and the bottom formed by the second substrate surface;
    forming a tungsten film on the substrate, the tungsten film having a seam formed within the feature and an overburden formed on the first substrate surface outside the feature;
    planarizing the substrate to remove the overburden from the first substrate surface so that a top of the tungsten film is about coplanar with the first substrate surface outside the feature;
    oxidizing the tungsten film to form a tungsten oxide pillar which extends from the at least one feature without a seam;
    reducing the tungsten oxide pillar to tungsten, the tungsten forming a substantially seamless tungsten gapfill within the at least one feature so that a top of the tungsten gapfill is below the first surface outside of the feature; and
    selectively depositing additional tungsten on the tungsten gapfill to raise the top of the tungsten gapfill to be substantially coplanar with the first substrate surface outside of the feature, selectively depositing additional tungsten comprises depositing a silicon film on the tungsten gapfill and exposing the silicon film to a tungsten halide to convert the silicon film to tungsten.

2. The method of claim 1, wherein one of the first material and the second material comprises a dielectric material and the other of the first material and the second material comprises a conductive material.

3. The method of claim 1, wherein formation of the tungsten film is performed by atomic layer deposition.

4. The method of claim 1, wherein the seam formed within the at least one feature is closed.

5. The method of claim 1, wherein a top of the seam formed within the at least one feature is above the sidewall so that the top of the seam is removed upon planarizing.

6. The method of claim 1, wherein the tungsten film is oxidized through thermal oxidation.

7. The method of claim 1, wherein the tungsten film is oxidized through plasma oxidation.

8. The method of claim 1, wherein reducing the tungsten oxide pillar comprises a thermal reduction process.

9. The method of claim 1, wherein reducing the tungsten oxide pillar comprises a plasma reduction process.

10. The method of claim 1, wherein after reducing the tungsten oxide pillar, a top of the tungsten gapfill is within ±10 Å of being coplanar with the first substrate surface outside of the feature.

11. A method of substrate processing comprising:
providing a substrate with at least one feature formed in a substrate surface, the feature extending a distance from the substrate surface and having a sidewall and a bottom, the sidewall of the feature and the substrate surface comprising a first material and the bottom comprising a second material different from the first material;
forming a tungsten film on the substrate so that there is a void within the tungsten film within the at least one feature and a tungsten overburden formed on the substrate surface;
planarizing the substrate to remove the tungsten overburden from the substrate surface so that a top of the tungsten film is substantially coplanar with the substrate surface;
oxidizing the tungsten film to form a pillar of tungsten oxide extending from the at least one feature without a seam; and
reducing the pillar of tungsten oxide to form a substantially seamless tungsten gapfill within the at least one feature where a top of the tungsten gapfill is below the substrate surface; and
selectively depositing additional tungsten to the tungsten gapfill to raise the top of the tungsten gapfill to be substantially coplanar with the substrate surface outside of the feature, selectively depositing additional tungsten comprises depositing a silicon film on the tungsten gapfill and exposing the silicon film to a tungsten halide to convert the silicon film to tungsten.

12. The method of claim 11, wherein formation of the tungsten film is performed by one or more of an atomic layer deposition process or a chemical vapor deposition process.

13. The method of claim 11, wherein the tungsten film is oxidized through one or more of a thermal oxidation process or a plasma oxidation process.

14. The method of claim 11, wherein reducing the pillar of tungsten oxide occurs through one or more of a thermal reduction process or a plasma reduction process.

15. A method of substrate processing comprising:
providing a substrate with a first substrate surface of a first material and a second substrate surface of a second material, the first material comprising a dielectric material and the second material comprising a conductive material, the substrate having at least one feature with a sidewall and a bottom, the sidewall formed by the first substrate surface and the bottom formed by the second substrate surface;
forming a tungsten film on the substrate by atomic layer deposition, the tungsten film having a closed seam formed within the feature and an overburden formed on the first substrate surface outside the feature, a top of the seam being above the sidewall;
planarizing the substrate to remove the overburden from the first substrate surface so that a top of the tungsten film is about coplanar with the first substrate surface outside the feature and the top of the seam is removed;
oxidizing the tungsten film by a thermal oxidation process or a plasma oxidation process to form a tungsten oxide pillar which extends from the feature without a seam;
reducing the tungsten oxide pillar to tungsten by a thermal reduction process or a plasma reduction process, the tungsten forming a substantially seamless tungsten gapfill within the feature, and a top of the tungsten gapfill being less than or equal to about 10 Å below the first substrate surface outside of the feature; and
depositing additional tungsten on the tungsten gapfill to raise the top of the tungsten gapfill to be substantially coplanar with the first substrate surface outside of the feature by depositing a silicon film on the tungsten gapfill and exposing the silicon film to a tungsten halide to convert the silicon film to tungsten.

* * * * *